United States Patent [19]

Sasaki et al.

[11] Patent Number: 5,045,725
[45] Date of Patent: Sep. 3, 1991

[54] INTEGRATED STANDARD CELL INCLUDING CLOCK LINES

[75] Inventors: Tohru Sasaki, Kanagawa; Kazuyuki Omote; Jun Iwamura, both of Yokohama, all of Japan

[73] Assignee: Kabushiki Kaisha Toshiba, Kawasaki, Japan

[21] Appl. No.: 330,613

[22] Filed: Mar. 30, 1989

[30] Foreign Application Priority Data

Mar. 31, 1988 [JP] Japan ................................. 63-78967

[51] Int. Cl.$^5$ ............................................ H01L 27/04
[52] U.S. Cl. ............................... 307/465; 307/303.2; 307/443; 307/481; 357/45
[58] Field of Search ............... 307/443, 465, 468, 480, 307/481, 591, 606, 303.2; 357/41, 45

[56] References Cited

U.S. PATENT DOCUMENTS

| | | | |
|---|---|---|---|
| 4,742,383 | 5/1988 | Fitzgerald | 307/465 X |
| 4,750,026 | 6/1988 | Kuminobu et al. | 357/45 X |
| 4,780,846 | 10/1988 | Tanabe et al. | 307/465 X |
| 4,825,107 | 4/1989 | Naganuma et al. | 307/465 |
| 4,851,717 | 7/1989 | Yabe | 307/480 X |

OTHER PUBLICATIONS

Bala Subramanian et al., "Program Logic Array with Metal Level Personalization", *IBM T. D. B.*, vol. 19, No. 6, Nov. 1976, pp. 2144-2145.

Mead and Conway, *Introduction to VLSI Systems*, Addison-Wesley Pub. Co., Reading, Mass., 1980, Plate 11 and pp. 150-154.

*Primary Examiner*—David Hudspeth
*Attorney, Agent, or Firm*—Foley & Lardner

[57] ABSTRACT

An integrated standard cell consisting of a plurality of standard cells each having a logical area, at least one power supply line, and one ground line, which further includes two clock signal lines for supplying clock signals. These signals are formed within each standard cell and are provided outside of the power supply line and the ground line, in parallel thereto. The two clock signal lines are connected to the logical area through each shunt line which substantially extends in the vertical direction to the clock signal lines. With this construction, a quantitative prediction for the time delay of clock signals which propagate in the clock signal lines becomes easy, thereby preventing any skew of the clock signals from occurring.

11 Claims, 7 Drawing Sheets

INTEGRATED STANDARD CELL INCLUDING CLOCK LINES

BACKGROUND OF THE INVENTION (1) Field of the Invention

The present invention relates to an integrated standard cell in which the layout of clock signal lines has been improved.

(2) Description of the Prior Art

As one development approach to Custom LSIs, a standard cell system has been heretofore proposed. In this system, desired LSIs can be realized by placement and routing of functional blocks (which are referred to hereunder as "cells") such as simple logical gates and flip-flops (F/Fs) which are preliminarily prepared including the power supply lines and ground lines.

FIG. 1 shows one example of the F/F circuit construction as a standard cell. The functional block comprises F/F section 1 which functions as a flop-flop and a clock signal generating section 3 for supplying clock signals $\phi$, $\bar\phi$ to the F/F section 1. In addition, a power supply wiring 5 shown by VDD and a ground wiring 7 shown by GND are formed so as to sandwich the F/F section 1 and the clock signal generating section 3.

Data as an input signal is applied to the F/F section 1 from the outside of the cell through a data line 9, VIA 11 and a contact hole 13. On the other hand, a reference clock signal as an input signal is supplied to the clock signal generating section 3 from the outside of the cell through a clock signal line 15, VIA 11, and another contact hole 13.

FIG. 2 shows one cell portion 17 in which data is applied to the cell 17 through a data line 19 made of, for instance, first Al layer and a successive line 21 made of a second Al layer which are connected by the VIA 11 which forms a metal wiring junction. On the other hand, the reference clock signal as well is applied to the cell through a clock signal line 23 made of a first Al layer and a succesive line 25 made of a second Al layer, connected by the VIA 11, similar to the data signal line.

These cells described above are arranged and wired by using an automatic placement and routing program as shown in FIG. 3. Namely, each of the cells 27, having substantially same height but having different width respectively is arranged so as to contact in the direction of the length of the cells or in the row direction. Each group of the contacted cells in the row direction is arranged in the column direction to have a space therebetween and the space is used for forming a wire.

Since each of the power supply lines and each of the ground lines are formed in each cell, the power supply line and the ground line of the adjacent cells can be automatically connected when the automatic placement and routing technique is applied. As a result, the power supply line and the ground line of the cells arranged in a same row are duly connected at the same time when the automatic arranging and wiring of the cells are carried out.

Whilst data lines and clock lines are connected by a multiple of VIAs 11, 11 in the areas sandwiched by two rows of cells as shown in FIG. 3, so as to supply data or clock signals to each cell. It is to be noted from the above description that the clock signal lines have been wired in accordance with the same design rules as those of the data lines in the automatic placement and routing technique, with the standard cells according to the prior art being used.

FIG. 4 shows an equivalent circuit of the clock signal line consisting of stray capacitors C, C which exist in the line and resistors R, R which represents the resistances of the line and the VIA 11. These capacitors and resistors cause a time delay or skew in the reference clock signal between the start point and the end point of the line, as shown in FIG. 4. This skew in the reference clock signal results in a malfunction of the cells to which the reference clock signal is supplied. In addition, the effect of the skew becomes significant as the frequency of the clock signal increases.

Accordingly, some countermeasures for the skew of the clock signal are required. When the clock signal lines are drawn here and there as shown in FIG. 3, however, it becomes difficult to predict each wiring length and the number of VIAs. This is turn results in the difficulty of accurately estimating the stray capacitors and the resistors, which is related to the skew problem.

Moreover, when the standard cell requires two kinds of the clock signals $\phi$ and $\bar\phi$ (its inverted clock signal) and these signals $\phi$, $\bar\phi$ are supplied independently from outside, a skew occurs between the clock signals $\phi$ and $\bar\phi$. In order to avoid this skew problem, it is necessary to generate within the cell, the clock signals $\phi$, $\bar\phi$ from the reference clock signal. However, when trying to do so, it becomes necessary to provide a clock generating circuit for every cell which requires two clock signals $\phi$, $\bar\phi$. Consequently, as the generated clock signals must be provided to logical circuits which require these two clock signals within the cell, additional area for clock wiring is required for the individual standard cells, which becomes a bar to high circuit integration.

SUMMARY OF THE INVENTION

It is therefore an object of the present invention to provide an integrated standard cell capable of preventing or reducing the skew of the clock signals.

It is another object of the present invention to provide a standard cell capable of reducing the area as well as achieving high circuit integration. One feature of the present invention resides in an integrated standard cell including a plurality of standard cells each having a logical area, comprising:

at least one clock signal line for supplying clock signals;

a shunt line connected between the logical area and said clock signal line for supplying the clock signals to the logical area;

at least one power supply line for supplying power to the logical area; and a ground line, said clock signal line of adjacent standard cells being arranged in parallel to said power supply line and said ground line within each of the standard cells, said shunt line being made of a metal layer which is different from that of said clock signal line.

These and other objects, features and advantages of the invention will be better understood from the following detailed description of the invention with reference to the attached drawings.

DESCRIPTION OF THE PREFERRED EMBODIMENT

Figure 1:
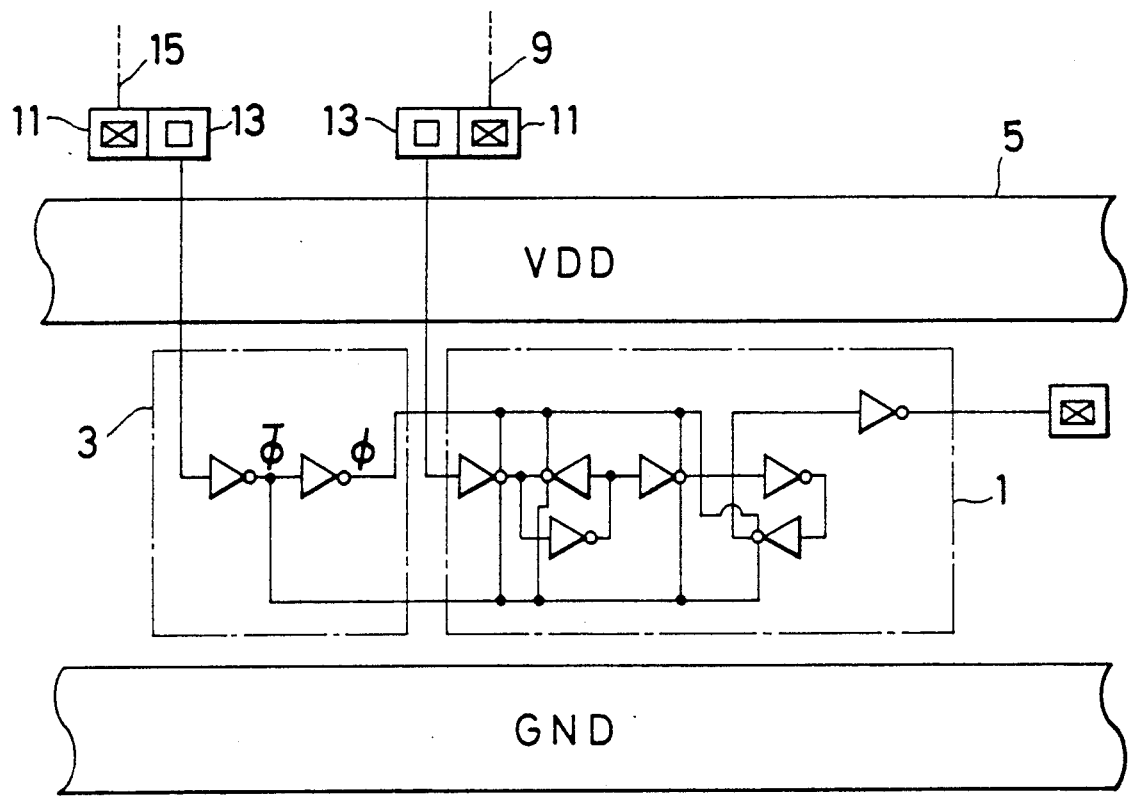
FIG. 1 illustrates one example of the standard cell according to the prior art.
Figure 2:
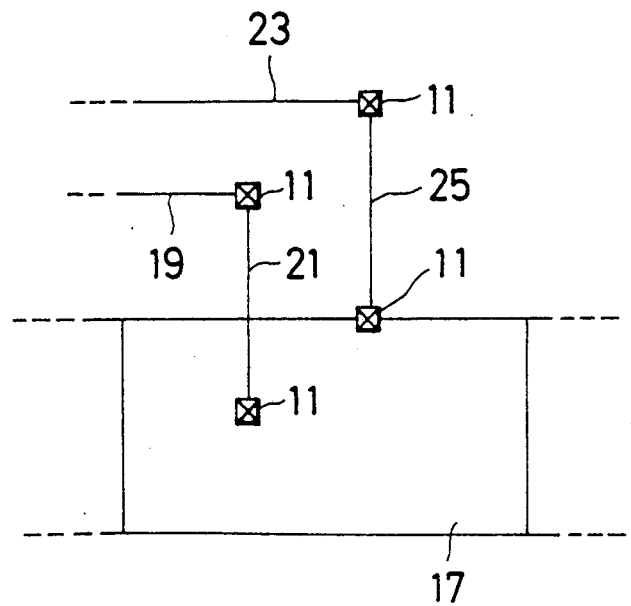
FIG. 2 illustrates one standard cell and its wirings according to the prior art.
Figure 3:
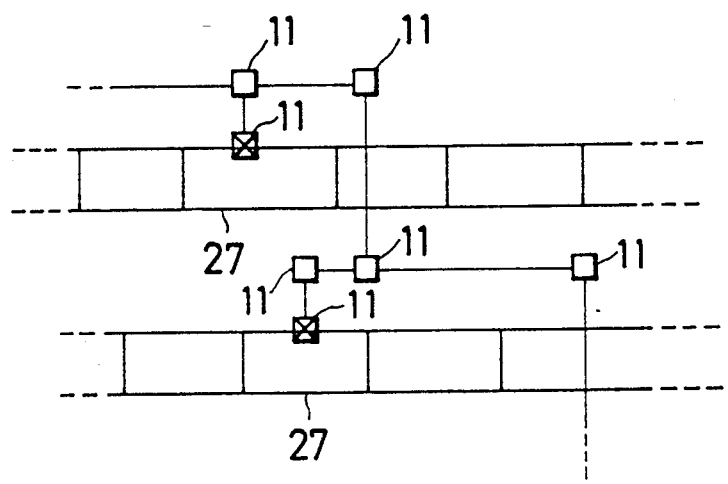
FIG. 3 illustrates a part of an integrated standard cell and their wirings according to the prior art.
Figure 4:
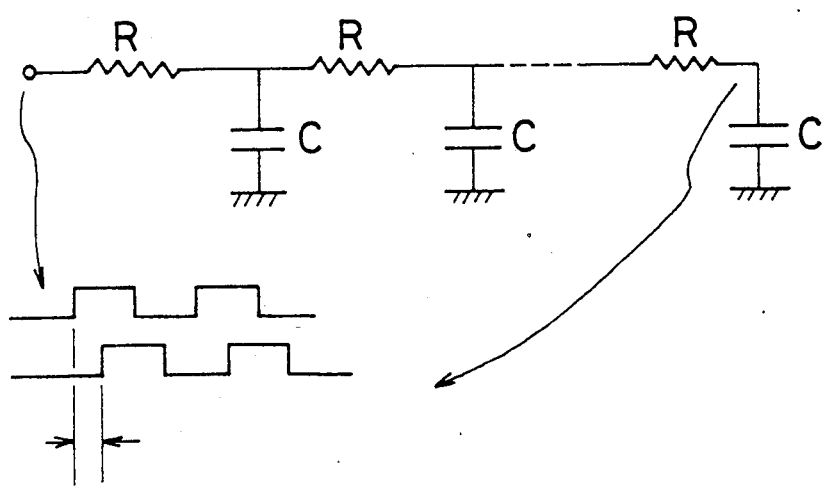
FIG. 4 illustrates an equivalent circuit of a clock signal line according to the prior art.
Figure 5:
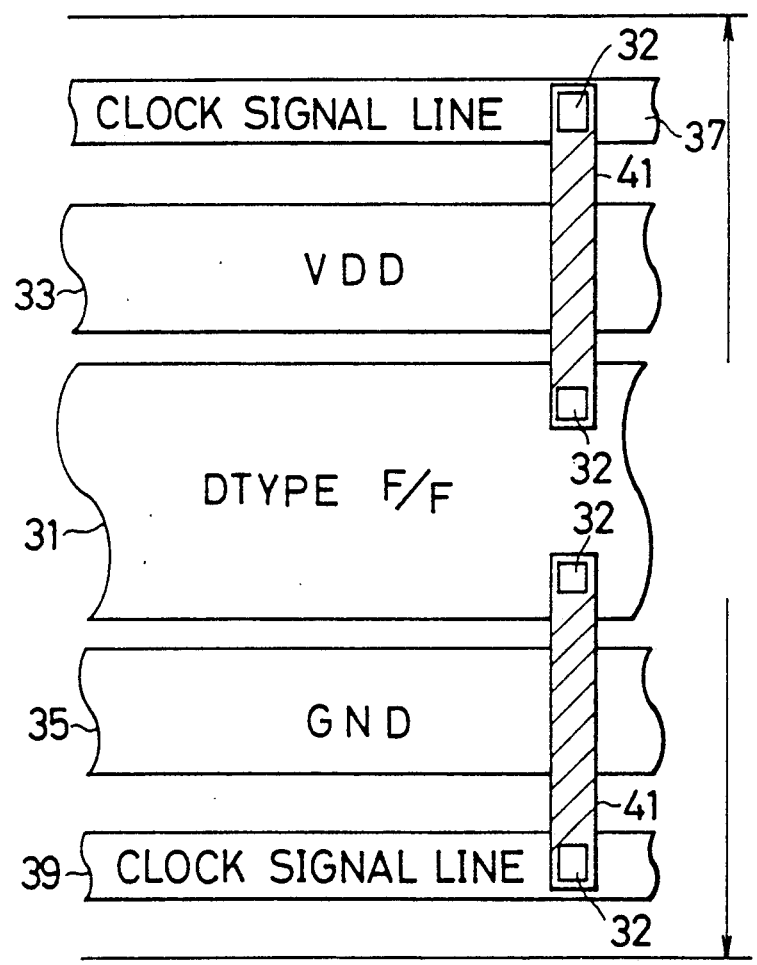
FIG. 5 illustrates one embodiment of a standard cell having two clock signal lines according to the present invention.

FIG. 5 shows one embodiment of the standard cell according to the present invention. The standard cell is of the type in which two clock signals $\phi$ and $\overline{\phi}$ opposite in phase to each other are supplied to a D type flip-flop (F/F).

The standard cell comprises a D type F/F section 31, a power supply line 33 (VDD) for power supply to the F/F 31, a ground line 35 (GND), a clock signal line 37 for supplying the clock signal $\phi$ and a clock signal line 39 for the clock signal $\overline{\phi}$. The clock signal lines 37 and 39 are arranged in parallel to the power supply line 33 and the ground line 35 and placed outside of 33 and 35 as the furthest outside of the cell. Namely, the clock signal lines 37 and 39 are arranged or laid out in accordance with the same design rules as those of the power supply line 33, the ground line 35, and the width of the cell.

Furthermore, each of the clock signal lines 37, 39 is connected to the F/F 31 through each connection 32 and each shunt line 41 which is formed by, for instance, polysilicon so as to intersect with the power supply line 33 and the ground line 35 made of, for instance, first Al layer. Namely, each shunt line 41 substantially extends in the vertical direction from the clock signal lines 37, 39. The clock signals $\phi$, $\overline{\phi}$ supplied to the clock lines 37 and 39 are applied to the F/F 31 through each of the shunt lines 41, 41 made of polysilicon.

Figure 6:
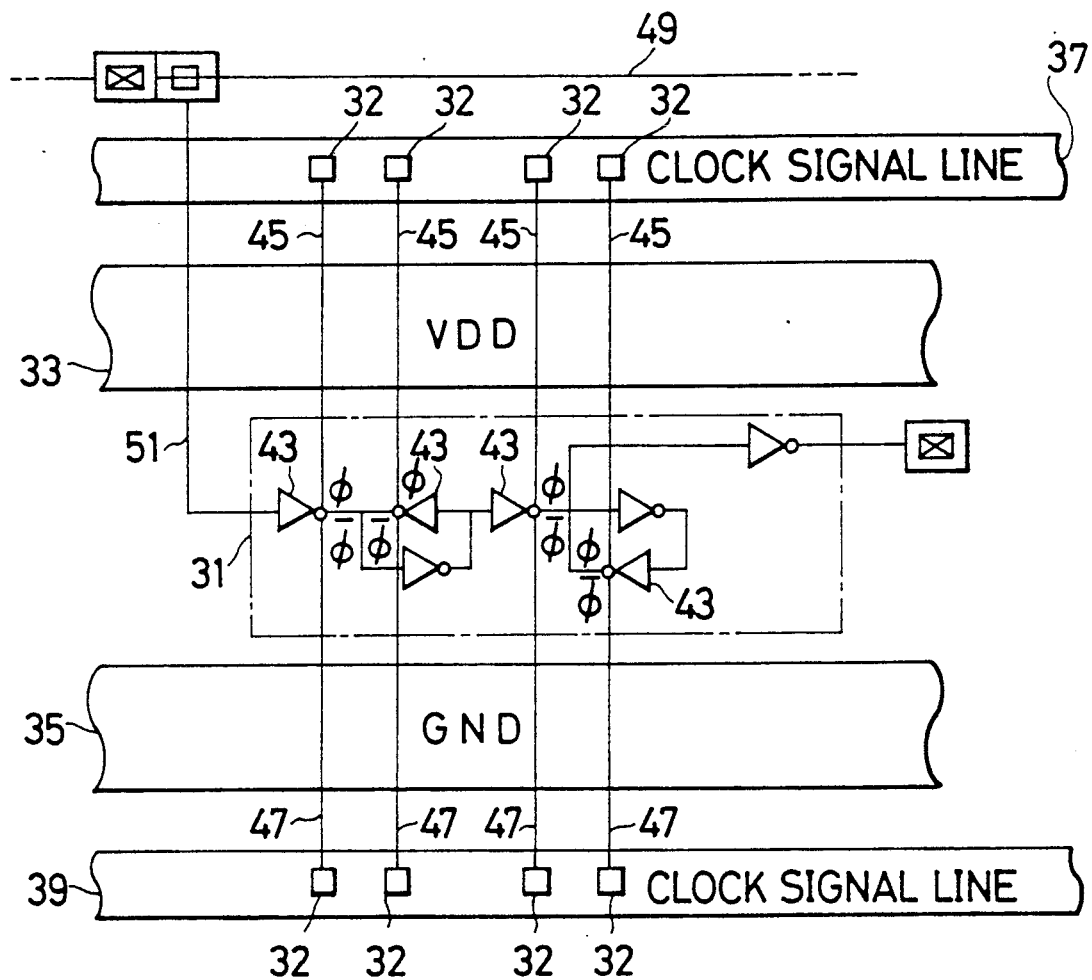
FIG. 6 illustrates another embodiment of a standard cell comprising a flip-flop in the logical circuit area, according to the present invention.

FIG. 6 indicates a standard cell according to the present invention in which the F/F 31 consists of tristate type inverter gates 43. In the figure, each clock signal $\phi$ from the clock signal line 37 is applied to each of the inverter gates 43, 43 through each of the corresponding shunt lines 45, 45 made of polysilicon while each clock signal $\overline{\phi}$ from the clock signal line 39 is applied to each of the inverter gates 43, 43 through each connection 32 and each of the corresponding shunt lines 47, 47 which are also made of polysilicon. Data from a data line 49 which is formed outside of the cell is applied to the input of the inverter gate 43 through the shunt line 51.

Figure 7:
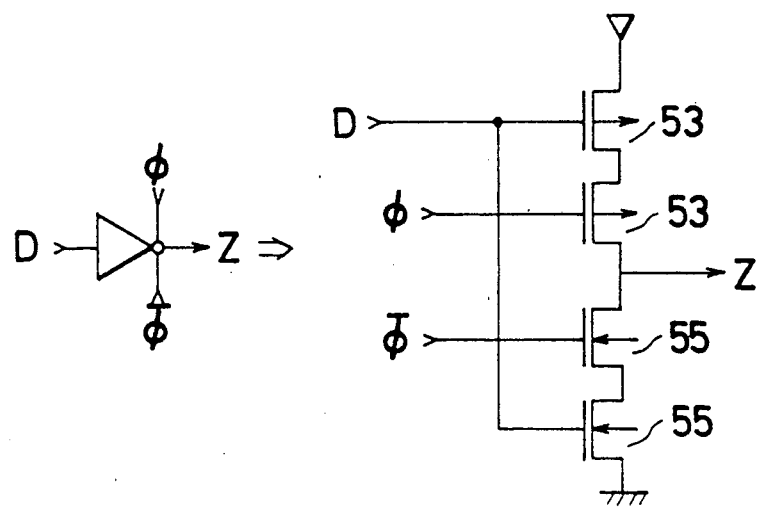
FIG. 7 illustrates a detailed circuit construction of the tristate inverter gate used in FIG. 6.

FIG. 7 shows a detailed construction of the tristate type inverter gate 43 shown in FIG. 6 In FIG. 7, the inverter gate consists of a pair of P-channel FETs 53 and a pair of N-channel FETs 55. The clock signals $\phi$, $\overline{\phi}$ are applied to the control gate of one of the P-channel FET 53 and the control gate of one of the N-channel FET 55, respectively, while data is applied to each gate of the other P-channel and N-channel FETs 53 and 55 and an output signal is picked up at the output terminal Z of the junction between the two FETs 53 and 55.

As described above, the clock signals $\phi$, $\overline{\phi}$ are normally applied to the control gates of FETs, so that the clock signal lines 37 and 39 (FIG. 6) which are formed, for instance, by the first Al layer are arranged outside of the power supply line 33 and the ground line 35 which are also formed by the same Al layer. The clock signals $\phi$, $\overline{\phi}$ are applied to each gate of the FETs through the shunt lines 45 and 47 made of the same polysilicon material as that of the gate of the FETs.

Figure 8:
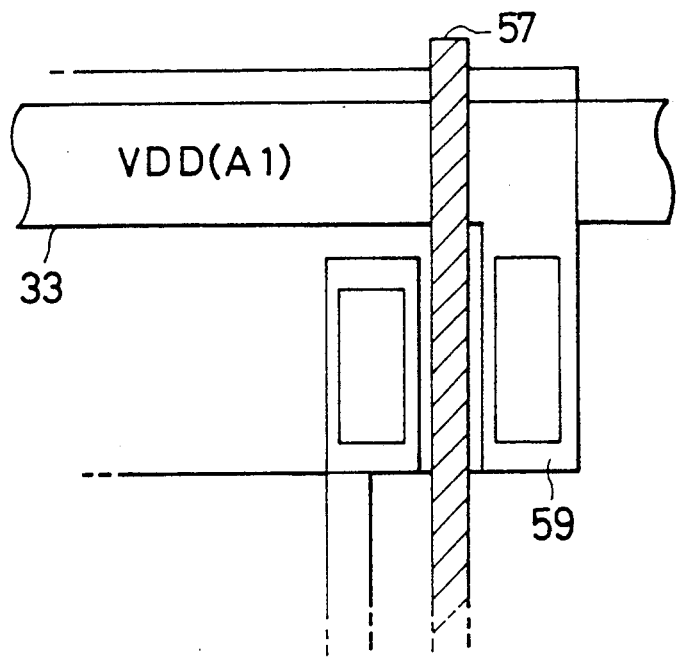
FIG. 8 illustrates a partially enlarged view of a power supply line.

FIG. 8 shows a partially enlarged view of the power supply line 33 and an FET having the gate 57 and the source area 59. Since the shunt lines 45 and 47 for the clock signals $\phi$, $\overline{\phi}$ are made of the same polysilicon as that of each gate of the FETs, the source area 59 of the FET can be easily connected to the power supply line 33 through the first Al layer.

As described in the foregoing embodiments according to the present invention, the clock signal lines 37 and 39 are arranged within the standard cell in accordance with the same design rules as those of the power supply lines 33 and the ground lines 35. Consequently, when the standard cells are automatically arranged and wired, the clock signal lines 37 and 39 of each cell can be connected as well as the power supply line 33 and the ground line 35 in the direction of the row of the standard cell. As a result, the length of the wirings of the clock signal lines 37, 39 as well as the number of contacts with the shunt lines 45, 47 can be easily predicted.

Moreover, by only increasing the width of the standard cells, the width of the clock signal lines 37, 39 can also be increased, thereby enabling the wiring resistance to be reduced. This in turn enables the countermeasures for the skew problems of the clock signals to facilitate in the automatic placement and routing of the standard cells.

Figure 9A:
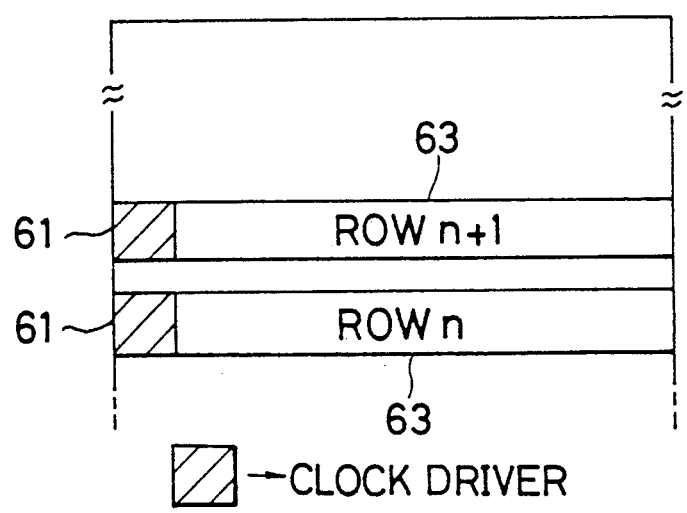
FIG. 9a illustrates an embodiment of an integrated standard cell consisting of a plurality of standard cells each row having a clock driver, according to the present invention.

FIG. 9 shows a row of standard cells 63, 63 each having a clock driver 61 for generating the clock signals $\overline{\phi}$ and 100. As shown in the figure, each of the clock drivers 61 can be automatically arranged at one of the extreme end of each row. As a result, the provision of each clock driver for generating the clock signals $\phi$, $\overline{\phi}$ per each standard cell can be dispensed with. This blocks the increase in the areas of the standard cells.

Figure 9B:
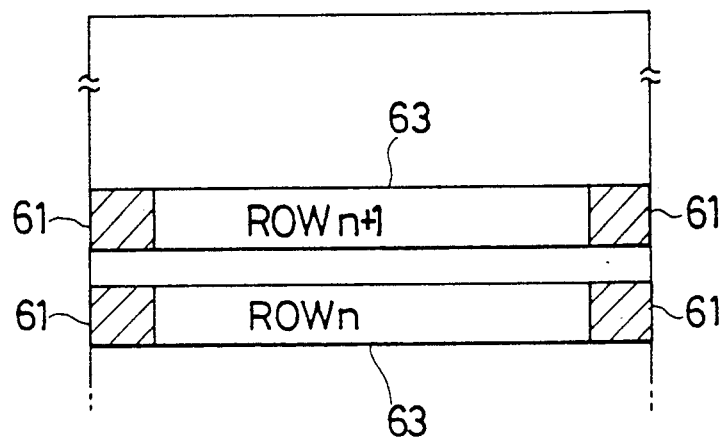
FIG. 9b and 9c illustrate embodiments of standard cells each row having a plurality of clock driver.

As shown in FIG. 9b, it is possible to automatically arrange each of the clock drivers 61 at both of the extreme end of each row. This arrangement is effective in the long row case.

Figure 9C:
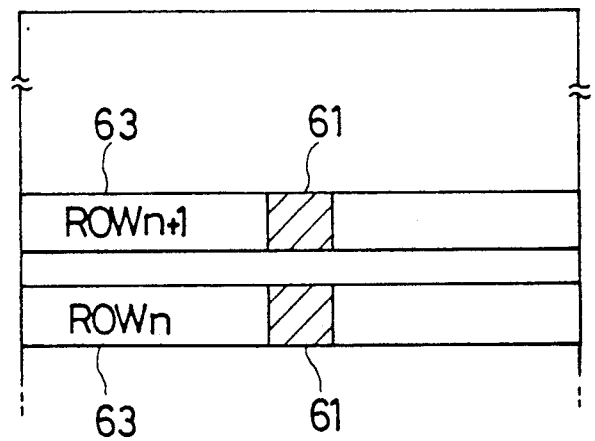

As shown in FIG. 9c, it is also effective to automatically arrange each of the clock drivers 61 at a mid portion of each row.

Figure 10:
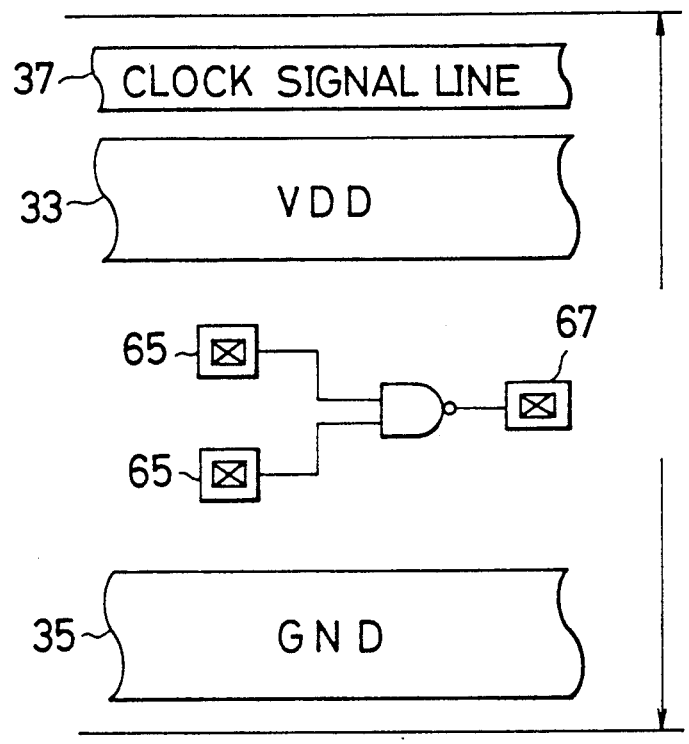
FIG. 10 illustrates another embodiment of a standard cell having a single clock signal line according to the present invention.

FIG. 10 shows still another embodiment of the standard cell according to the present invention. In FIG. 10, the standard cell having an external input terminals 65 and an external output terminal 67 may comprise a single clock signal line 37 within the cell when it requires only one clock signal φ. Reference numerals 33 and 35 indicate the power supply and ground lines respectively.

Figure 11:
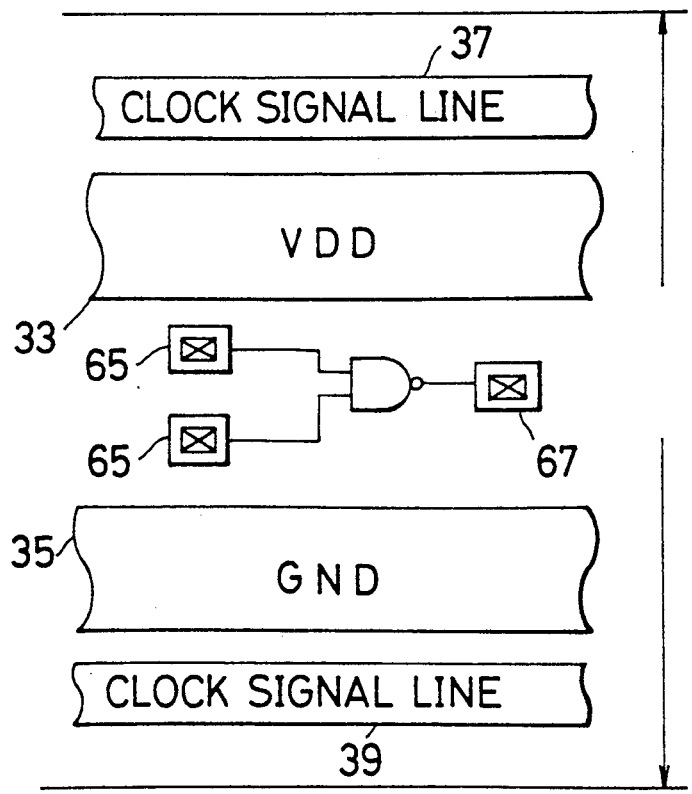
FIG. 11 illustrates still another embodiment of a standard cell having two clock signal lines according to the present invention.

FIG. 11 shows a standard cell having, two clock signal lines 37, 39 used by an automatic placement and routing technique, although it necessitates no clock signals.

As has been described above, since the clock signal lines are formed in parallel with the power supply lines and the ground lines within the standard cell according to the present invention, with a plurality of standard cells successively arranged, reduction of the clock delays can be achieved. A quantitative prediction for the time delay of clock signals which propagate in the clock lines becomes also easy, thus preventing or reducing the skew of the clock signals.

Moreover, clock drivers for generating the clock signals can be also provided at least one side of the standard cells arranged successively, so as to supply clock signals from the drivers to the standard cells. As a result, any circuit for generating the clock signal per each standard cell can be dispensed with, thereby reducing the areas of the standard cells as well as achieving high circuit integration.

While the invention has been described in its preferred embodiments, it is to be understood that the words which have been used are words of description rather than limitation and that various changes and modifications may be made within the purview of the appended claims without departing from the true scope and spirit of the invention in its broader aspects.

What is claimed is:

1. A row of standard cells, each cell including:
   a Vdd line for supplying a high voltage to the cell;
   a Vss ground line for supplying a low voltage to the cell; and
   a clock signal line for supplying clock pulses to the cell; wherein said Vdd, Vss and clock lines are connected directly to the corresponding lines of an adjacent cell at a boundary therebetween in the row in order to form a continuous line respectively.

2. The row of standard cells of claim 1, wherein each cell further includes an inverted clock line for supplying inverted clock pulses to the cell, the inverted clock lines of each cell being connected to the corresponding line of an adjacent cell in order to form a continuous inverted clock line.

3. The row of standard cells as claimed in claim 1, further including shunt lines made of a polysilicon layer for supplying clock signals to a logical area of the cell.

4. The row of standard cells as claimed in claim 1,
   said clock signal line being arranged in parallel to said power supply line and said ground line within the standard cell.

5. The row of standard cells as claimed in claim 1, wherein a shunt line extends in a direction perpendicular to said clock signal line.

6. The row of standard cells as claimed in claim 2, wherein said clock signal lines are arranged to lie outside of the power supply line and the ground line, when viewed from the logical area of the cell.

7. The row of standard cells as claimed in claim 1, wherein said clock signal line, power supply line, and ground line are made of an aluminum layer.

8. The row of standard cells as claimed in claim 1, further comprising:
   a clock generating circuit arranged at the middle of one of said rows of standard cells, and connected with said clock signal lines to supply clock signals to the standard cells.

9. The row of standard cells of claim 1, further comprising an inverted clock line for providing inverted clock pulses.

10. A row of standard cells, as claimed in claim 1, in which the clock line is used exclusively to transfer clock signals from a cell to an adjacent cell.

11. A standard cell, comprising:
   constituent semiconductor elements, including a field effect transistor, for clock operation;
   a Vdd line for supplying a high voltage to said transistor;
   a Vss ground line for supplying a low voltage to said transistor;
   a clock line for supplying clock pulses; and
   a polysilicon pattern forming a gate electrode of said transistor and extending to make electrical contact with said clock line.

* * * * *